US012698560B2

(12) United States Patent  
Eisaman et al.

(10) Patent No.: US 12,698,560 B2  
(45) Date of Patent: Aug. 4, 2026

(54) METHODS FOR PRODUCING N-DOPED GRAPHENE FILMS

(71) Applicant: The Research Foundation for The State University of New York, Albany, NY (US)

(72) Inventors: Matthew Eisaman, Port Jefferson, NY (US); Jan Folkson, Williston Park, NY (US); Joseph Andrade, Stony Brook, NY (US)

(73) Assignee: The Research Foundation for The State University of New York, Albany, NY (US)

( * ) Notice: Subject to any disclaimer, the term of this patent is extended or adjusted under 35 U.S.C. 154(b) by 541 days.

(21) Appl. No.: 17/298,068

(22) PCT Filed: Nov. 29, 2019

(86) PCT No.: PCT/US2019/063864  
§ 371 (c)(1),  
(2) Date: May 28, 2021

(87) PCT Pub. No.: WO2020/113171  
PCT Pub. Date: Jun. 4, 2020

(65) Prior Publication Data  
US 2022/0119941 A1 Apr. 21, 2022

Related U.S. Application Data

(60) Provisional application No. 62/773,665, filed on Nov. 30, 2018.

(51) Int. Cl.  
*B32B 9/00* (2006.01)  
*C23C 16/01* (2006.01)  
(Continued)

(52) U.S. Cl.  
CPC .............. *C23C 16/26* (2013.01); *C23C 16/01* (2013.01); *C23C 16/02* (2013.01)

(58) Field of Classification Search  
CPC ....... B82Y 30/00; Y10T 428/30; C23C 16/26; C23C 16/01; C23C 16/02  
(Continued)

(56) References Cited

U.S. PATENT DOCUMENTS 8,236,118 B2 8/2012 Veerasamy  
8,530,554 B1 9/2013 McCleskey et al.  
(Continued)

FOREIGN PATENT DOCUMENTS

CN 104528699 A 4/2015  
CN 104803370 A 7/2015  
(Continued)

OTHER PUBLICATIONS

Dissanayake, D. M. N. M. et al., "Spontaneous and Strong Multilayer Graphene N-Doping on Soda-Lime Glass and its Application in Graphene-Semiconductor Junctions", Scientific Reports (2016), vol. 6:21070, DOI: 10.1038/srep21070, 7 pgs.  
(Continued)

*Primary Examiner* — Daniel H Miller  
(74) *Attorney, Agent, or Firm* — Fox Rothschild LLP

(57) ABSTRACT

Provided are methods for producing n-doped graphene films. The method comprises contacting a graphene layer with an alkali metal-doped polymer layer. Compositions comprising (i) a substrate, (ii) a doped polymer, and (iii) graphene are also provided. The methods of the invention produce n-doped graphene films that are resistant to degradation, have high electrical conductivity, and low sheet resistance without altering the optical transmission of graphene.

42 Claims, 9 Drawing Sheets

(51) Int. Cl.
    *C23C 16/02*        (2006.01)
    *C23C 16/26*        (2006.01)

(58) Field of Classification Search
    USPC ........................................................ 428/408
    See application file for complete search history.

(56)              References Cited

U.S. PATENT DOCUMENTS

| | | | |
|---|---|---|---|
| 8,808,810 | B2 | 8/2014 | Veerasamy |
| 8,871,302 | B2 | 10/2014 | Teng et al. |
| 8,890,123 | B2 | 11/2014 | Wu |
| 8,940,576 | B1 | 1/2015 | Bui et al. |
| 8,981,357 | B2 | 3/2015 | Yoon et al. |
| 9,053,932 | B2 | 6/2015 | Lee et al. |
| 9,172,022 | B2 | 10/2015 | Lee et al. |
| 9,216,435 | B2 | 12/2015 | Sánchez et al. |
| 9,269,764 | B2 | 2/2016 | Ahn et al. |
| 9,281,385 | B2 | 3/2016 | Shin et al. |
| 9,327,983 | B2 | 5/2016 | Kwon et al. |
| 9,418,770 | B2 | 8/2016 | Veerasamy |
| 9,443,639 | B2 | 9/2016 | Lee et al. |
| 9,518,188 | B2 | 12/2016 | Lettow et al. |
| 9,540,498 | B1 | 1/2017 | Scheffer et al. |
| 9,576,695 | B2 | 2/2017 | Yang et al. |
| 9,645,454 | B2 | 5/2017 | Naito et al. |
| 9,892,821 | B2 | 2/2018 | Sohn et al. |
| 9,900,979 | B2 | 2/2018 | Sohn et al. |
| 10,083,773 | B2 | 9/2018 | Na et al. |
| 10,105,875 | B2 | 10/2018 | Young et al. |
| 10,166,811 | B1 | 1/2019 | Lettow et al. |
| 10,177,261 | B2 | 1/2019 | Yoon et al. |
| 10,287,677 | B2 | 5/2019 | Ozkan et al. |
| 10,483,104 | B2 | 11/2019 | Naito et al. |
| 10,497,893 | B2 | 12/2019 | Moon et al. |
| 10,651,360 | B2 | 5/2020 | Lee et al. |
| 10,685,761 | B2 | 6/2020 | Kinlen et al. |
| 10,700,282 | B2 | 6/2020 | Rafailovich et al. |
| 10,730,070 | B2 | 8/2020 | Lin et al. |
| 10,731,041 | B2 | 8/2020 | Hendricks et al. |
| 10,748,714 | B2 | 8/2020 | Schumann et al. |
| 11,049,666 | B2 | 6/2021 | Popoola et al. |
| 11,251,435 | B2 | 2/2022 | Shibano et al. |
| 11,332,830 | B2 | 5/2022 | Lin et al. |
| 11,404,182 | B2 | 8/2022 | Yun et al. |
| 11,901,177 | B2 | 2/2024 | Irwin et al. |
| 2011/0014492 | A1 | 1/2011 | Joshi et al. |
| 2011/0041980 | A1 | 2/2011 | Kim et al. |
| 2011/0088931 | A1* | 4/2011 | Lettow ................... D21H 19/10 |
| | | | 428/476.3 |
| 2011/0127471 | A1 | 6/2011 | Shin et al. |
| 2012/0142832 | A1 | 6/2012 | Varma et al. |
| 2012/0145234 | A1 | 6/2012 | Roy-Mayhew et al. |
| 2012/0282446 | A1 | 11/2012 | Jo et al. |
| 2013/0081678 | A1* | 4/2013 | Naito ...................... C23C 16/26 |
| | | | 977/734 |
| 2013/0206227 | A1 | 8/2013 | Shimizu et al. |
| 2014/0065402 | A1 | 3/2014 | Suckeveriene et al. |
| 2014/0087164 | A1 | 3/2014 | LeMieux et al. |
| 2014/0295179 | A1 | 10/2014 | Naito et al. |
| 2015/0279504 | A1 | 10/2015 | Viville et al. |
| 2016/0027935 | A1 | 1/2016 | Naito et al. |
| 2016/0276609 | A1 | 9/2016 | Horiuchi et al. |
| 2017/0057827 | A1 | 3/2017 | Sultana et al. |
| 2017/0148970 | A1 | 5/2017 | Yu et al. |
| 2018/0130569 | A1 | 5/2018 | Wang et al. |
| 2018/0142346 | A1 | 5/2018 | Le Poche et al. |
| 2019/0143369 | A1 | 5/2019 | Lin et al. |
| 2019/0143656 | A1 | 5/2019 | Lin et al. |
| 2019/0283379 | A1 | 9/2019 | Lin et al. |
| 2019/0284712 | A1 | 9/2019 | Lin et al. |
| 2019/0288292 | A1 | 9/2019 | Shibano et al. |
| 2019/0292675 | A1 | 9/2019 | Lin et al. |
| 2019/0292676 | A1 | 9/2019 | Lin et al. |
| 2019/0292722 | A1 | 9/2019 | Lin et al. |
| 2019/0296361 | A1 | 9/2019 | Shibano et al. |
| 2019/0312282 | A1 | 10/2019 | Shibano et al. |

FOREIGN PATENT DOCUMENTS

| | | |
|---|---|---|
| CN | 106435632 A | 2/2017 |
| CN | 106744872 A | 5/2017 |
| CN | 106189229 B | 8/2019 |
| EP | 3470368 A1 | 4/2019 |
| JP | 5902498 B2 | 4/2016 |
| JP | 6697406 B2 | 5/2020 |
| KR | 101092378 B1 | 12/2011 |
| KR | 101166528 B1 | 7/2012 |
| KR | 20130016846 A | 2/2013 |
| KR | 20130096836 A | 9/2013 |
| KR | 20130123269 A | 11/2013 |
| KR | 101368564 B1 | 2/2014 |
| KR | 20140094480 A | 7/2014 |
| KR | 101473693 B1 | 12/2014 |
| KR | 101486956 B1 | 1/2015 |
| KR | 101564226 B1 | 10/2015 |
| KR | 101582834 B1 | 1/2016 |
| KR | 101594524 B1 | 2/2016 |
| KR | 20160030659 A | 3/2016 |
| KR | 101614318 B1 | 4/2016 |
| KR | 101635835 B1 | 7/2016 |
| KR | 101742955 B1 | 6/2017 |
| KR | 101911146 B1 | 10/2018 |
| KR | 20180115659 A | 10/2018 |
| KR | 20180123225 A | 11/2018 |
| KR | 102001491 B1 | 7/2019 |
| KR | 102025364 B1 | 9/2019 |
| KR | 102072888 B1 | 2/2020 |
| KR | 102220780 B1 | 2/2021 |
| WO | 2013105768 A1 | 7/2013 |
| WO | 2018215687 A1 | 11/2018 |
| WO | 2019099061 A1 | 5/2019 |
| WO | 2019182624 A1 | 9/2019 |
| WO | 2019183044 A1 | 9/2019 |
| WO | 2019183205 A1 | 9/2019 |
| WO | 2020073101 A1 | 4/2020 |

OTHER PUBLICATIONS

Kim, H. H. et al., "Substrate-Induced Solvent Intercalation for Stable Graphene Doping", ACS Nano (2013), vol. 7:2, pp. 1155-1162.

Kwon, K. C. et al., "Work-Function Decrease of Graphene Sheet Using Alkali Metal Carbonates", J. Phys. Chem. (2012), vol. 116, pp. 26586?26591.

Sanders. S. et al., "Engineering High Charge Transfer N-Doping of Graphene Electrodes and its Application to Organic Electronics", Nanoscale (2015), vol. 7, pp. 13135-13142.

Sutter, P. et al., "Chemistry under Cover: Tuning Metal-Graphene Interaction by Reactive Intercalation", J. Am. Chem. Soc. (2010), vol. 132, pp. 8175-8179.

Xue, M. et al., "Superconductivity in Potassium-Doped Few-Layer Graphene", J. Am. Chem. Soc. (2012), vol. 134, pp. 6536-6539.

Barlow, S. et al., "Metal-Organic Complexes for Doping Organic Semiconductors and Surface Doping"; Sigman-Aldrich (2016); 5 pgs. downloaded Jan. 27, 2020 from www.sigmaaldrich.com.

Martinez, U. et al. "Critical Role of Intercalated Water for Electrocatalytically Active Nitrogen-Doped Graphitic Systems"; Science Advances (2016); vol. 2:3; 3 pgs.

\* cited by examiner

Copper Removal

EVA/PET
Cu/Gr

45 μm Cu
0.35 nm Gr
240 μm

EVA/PET

APS Solution

Copper Dissolves into the Ammonium
Persulfate After Twenty-four
Hours of Immersion.

Copper Removal

Hall Effect System Setup

PC & Control Software

Power Supply

Lock-in Amp.

Magnet Cavity

Sample Tray

Sample

Sample Card

System is Run with 10 µA Current and a 1 T B-field

METHODS FOR PRODUCING N-DOPED GRAPHENE FILMS

FIELD OF THE INVENTION

The present disclosure relates to n-doped graphene films, and more particularly to techniques for fabrication of n-doped graphene films.

BACKGROUND

Graphene thin films that are both optically transparent and electrically conductive, are an important component in many devices, including transparent electrodes and conductive films in displays, touch screens, windows, and solar cells; and an emerging suite of biomedical applications such as smart contact lenses. It is a challenge to engineer thin films that are highly transparent to visible light, while simultaneously having little resistance to the flow of electrical current. In addition to improved electro-optical performance, graphene films have desirable properties not possible with today's materials, including flexibility, low cost, negligible optical scattering, extreme strength, and impermeability to water vapor.

Due to its optical transparency and electrical conductivity, graphene has the potential for applications as transparent electrodes and conductive, optically transparent windows. Graphene films combine mechanical strength, electrical mobility, and optical transparency (2.3% absorption per layer over all visible wavelengths) into one material, and appear to be a promising material for many applications that require simultaneously large values of optical transparency and electrical conductivity, such as transparent electrodes. However, for graphene to serve as a high-performance material, it should have a sufficiently high electrical conductivity within the plane of the film, which is proportional to the product of the graphene mobility and carrier concentration. To increase the electrical conductivity of graphene, it may be strongly doped with extra charge carriers. Controllably and strongly doping graphene in a way that is manufacturable and resists degradation presents a major challenge to graphene's use for transparent electrodes.

Applications such as the capacitance-based touch-screens on many smartphones, tablets, and displays require optically transparent, electrically conductive films with ever-increasing demands on performance. Maintaining response times with increasing screen size requires lower electrical resistance for the same optical transmittance. The "sheet resistance"—with units of $\Omega/\square$, pronounced "ohms per square"—is the typical measure of resistance to electrical flow within the plane of thin films. Maintaining the same touch response time for larger screens will require reducing the sheet resistance by a factor of two compared to the state-of-the-art transparent electrode material, indium tin oxide. Another application of high-performance graphene films is electromagnetic interference (EMI)-shielding films with improved optical transparency.

Persistent and strong graphene doping that is resistant to degradation has been difficult to achieve, in particular, due to the remaining challenges of alkali metal reactivity and the lack of a scalable process. To address these challenges, we have developed a method for significantly lowering the sheet resistance of graphene on polymer substrates by incorporation of alkali-metal salts into the substrates that strongly n-dope graphene. Lowering sheet resistance will enable applications such as transparent electrodes that desire flexible graphene-on-substrate systems with high optical transparency and low sheet resistance. Further, the use of compounds stably incorporated into the polymer reduce degradation seen with other doping methods. The method can be easily integrated into existing polymer production manufacturing lines at low cost.

SUMMARY OF THE INVENTION

It is an object of the present invention to provide a method for making n-doped graphene films and compositions comprising a doped polymer and a graphene film. The compositions comprise a graphene layer in contact with a doped polymer layer. The doped polymer layer comprises an alkali metal salt dispersed in a polymer matrix.

The invention provides a method for producing n-doped graphene films on a substrate wherein the method comprises: (i) preparing a doped polymer solution comprising an alkali metal salt, a polymer and a solvent; (ii) coating a surface of a substrate with the doped polymer solution to form a coated substrate; and (iii) contacting a graphene layer with the coated substrate.

The invention further provides a method for producing n-doped graphene films on a substrate wherein the method comprises: (i) preparing a doped polymer solution comprising an alkali metal salt, a polymer and a solvent; and (ii) coating a graphene layer with the doped polymer solution to form a coated graphene layer; (iii) coating a surface of a substrate with the doped polymer solution to form a coated substrate; and (iv) contacting the coated graphene layer with the coated substrate.

The invention further provides a method for producing n-doped graphene films on a substrate wherein the method comprises: (i) preparing a doped polymer solution comprising an alkali metal salt, a polymer and a solvent; (ii) coating a graphene layer with the doped polymer solution to form a coated graphene layer; and (iii) contacting the coated graphene layer with the uncoated substrate.

The invention also provides a method for producing n-doped graphene films on a substrate wherein the method comprises: (i) preparing a doped polymer solution comprising an alkali metal salt, a polymer and a solvent; (ii) coating a graphene layer with the doped polymer solution to form a coated graphene layer; and (iii) curing the doped polymer.

Compositions comprising (i) a substrate, (ii) a doped polymer, and (iii) graphene are also provided. In another aspect, the invention provides an electronic and/or optical device.

A more complete understanding of the present invention, as well as further features and advantages of the present invention, will be obtained by reference to the following detailed description of drawings.

DETAILED DESCRIPTION OF THE INVENTION

Figure 1:
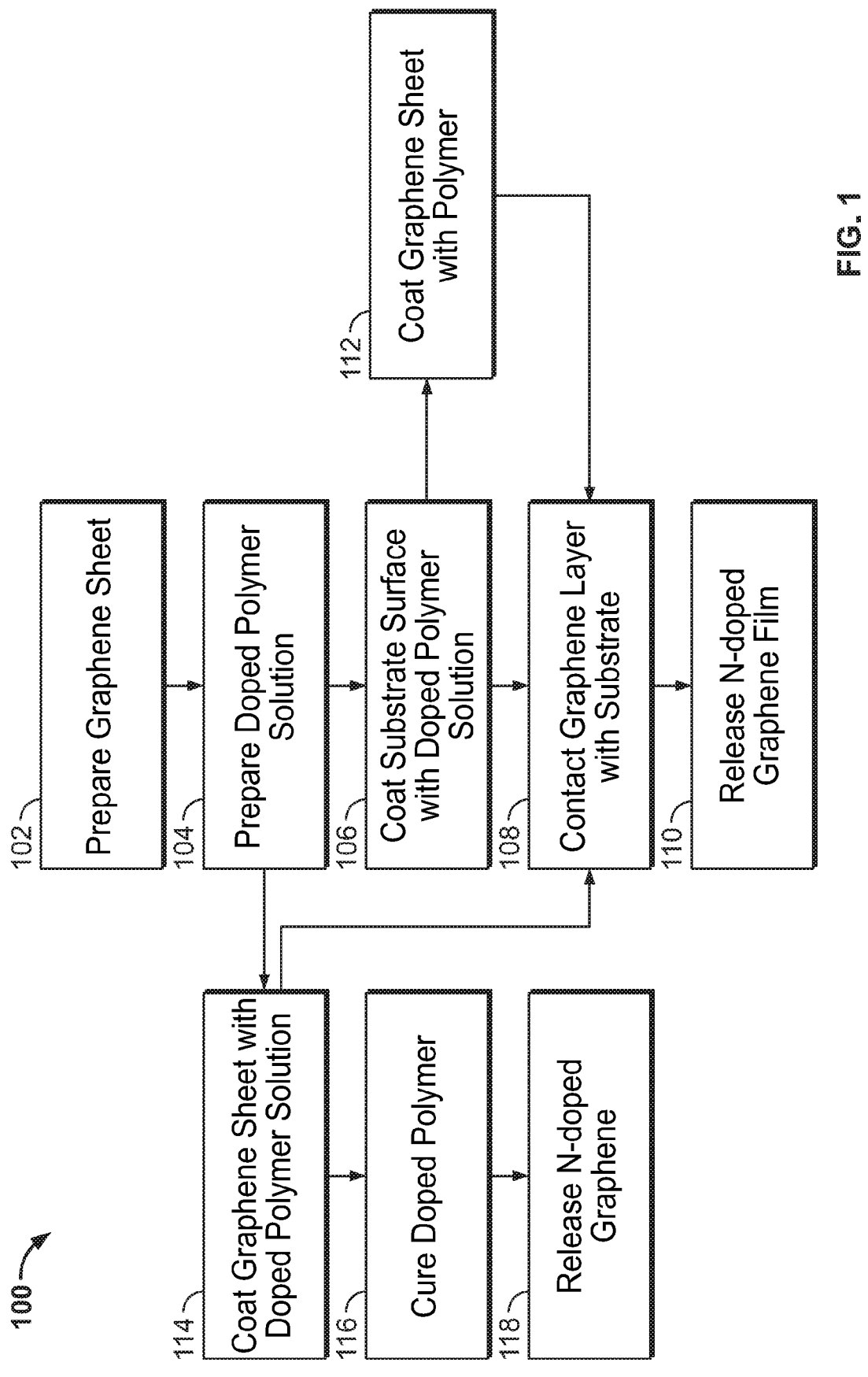
FIG. 1 is a flowchart illustrating exemplary methodologies for producing n-doped graphene films.
Figure 2:
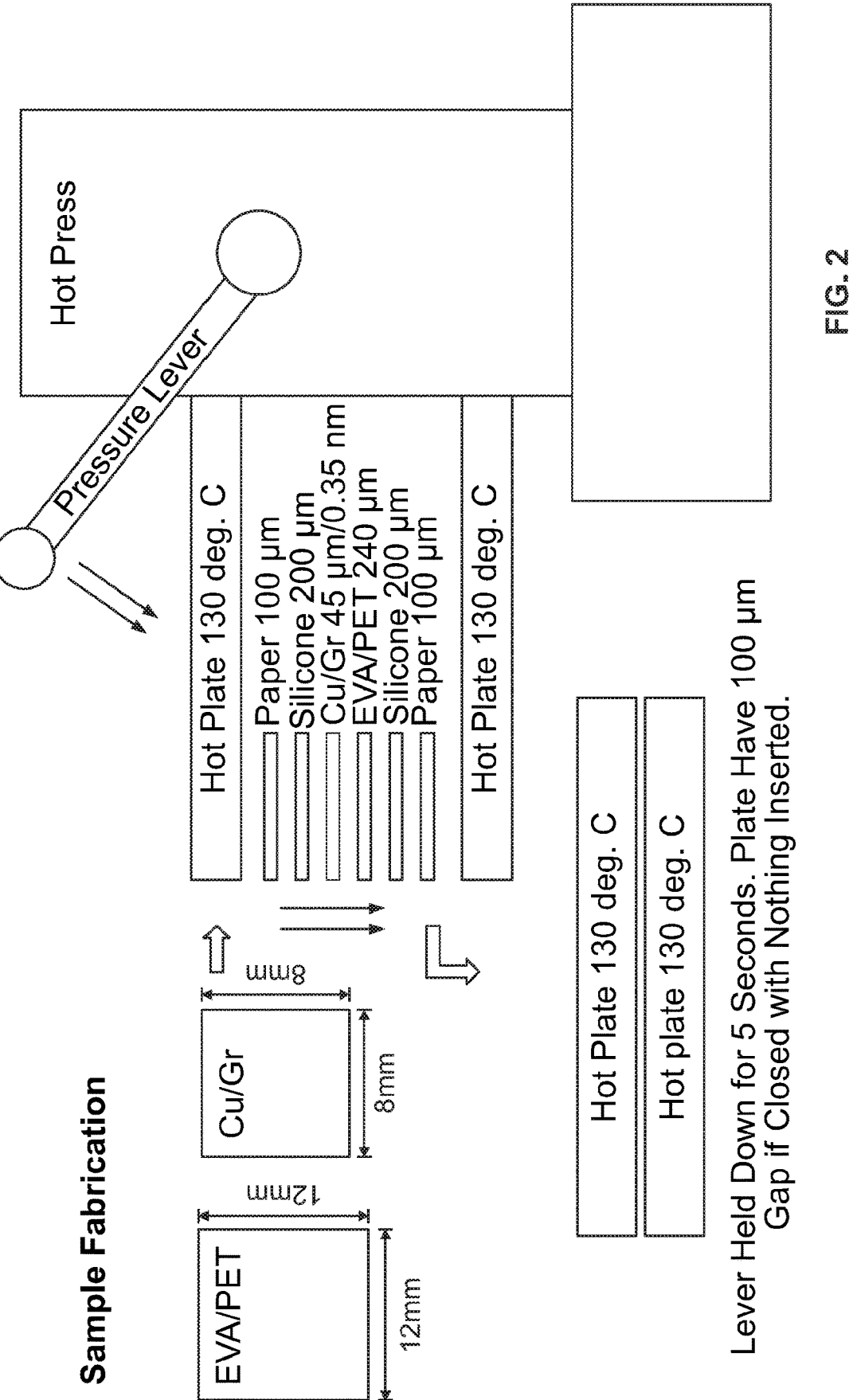
FIG. 2 is a schematic of an illustrative method for sample fabrication.
Figure 3:
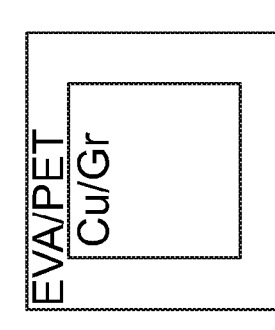
FIG. 3 is a schematic of an illustrative process for Cu removal by etching with ammonium persulfate (APS).
Figure 4:
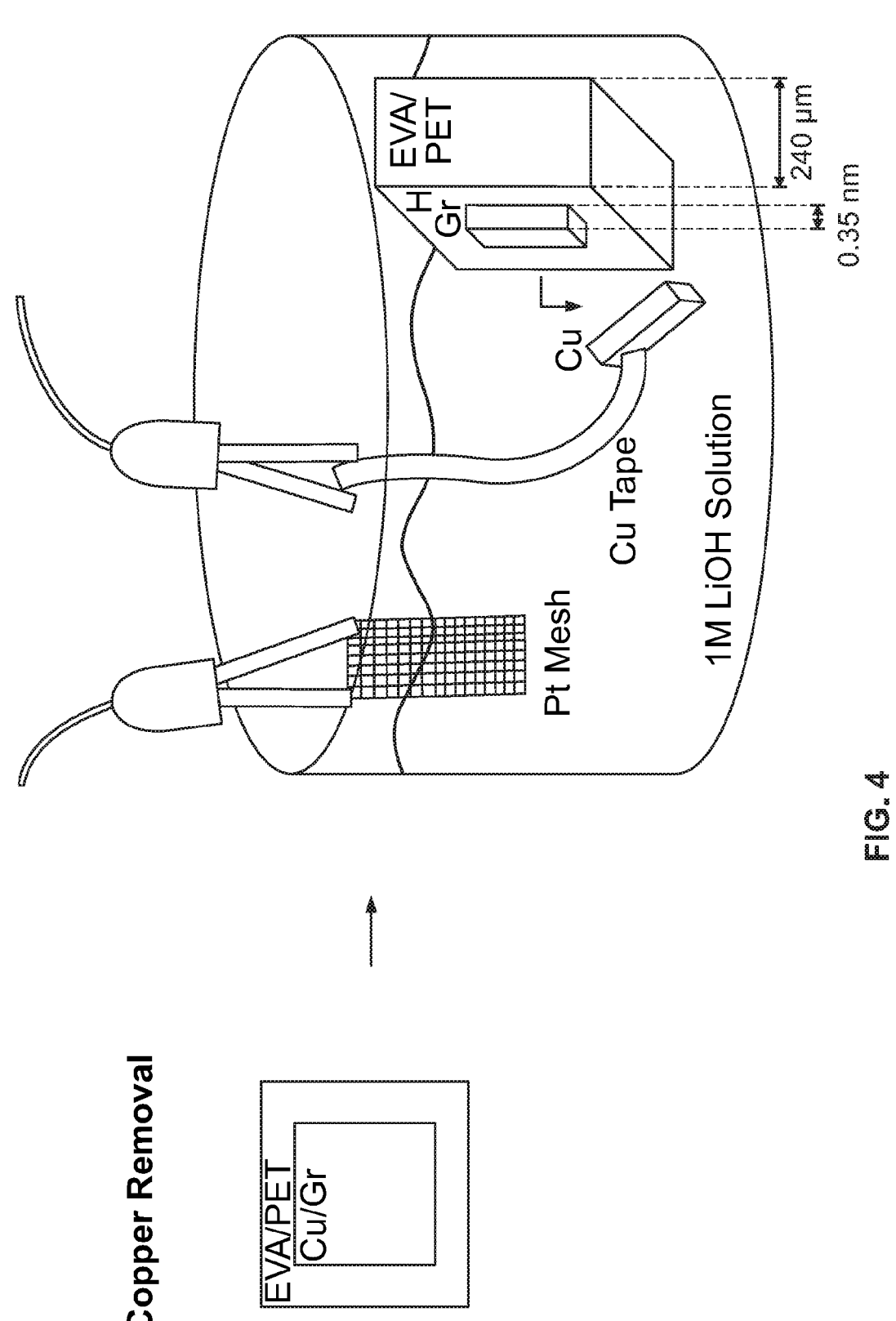
FIG. 4 is a schematic of an illustrative process for Cu removal by electrochemical delamination. Electrolysis is performed with a 20 mA constant current. Initially Cu is in contact with Gr on EVA/PET substrate. After about 10 seconds hydrogen bubbles from the electrolysis between graphene and Cu cause the Cu to lose contact with the graphene.

To achieve a high value of mobility when a graphene film is in contact with a substrate involves control over the scattering of graphene charge carriers through substrate interactions that can reduce mobility values. With respect to carrier concentration, intrinsic (undoped) graphene has low carrier concentration values that rule out intrinsic graphene as a suitable material for electronics applications. To achieve sufficiently high carrier concentrations to serve as high-performance material in applications such as transparent electrodes involves doping the graphene (donating electrons to serve as charge carriers or borrowing electrons so that holes serve as charge carriers). Graphene can be doped to sufficiently high values of carrier concentration without altering the optical transmission of 2.3% per layer, thus opening up the possibility of highly optically transparent graphene films with large values of electrical conductivity within the graphene plane, i.e., low values of sheet resistance.

In contrast to substitutional doping, where a dopant atom (e.g., nitrogen) takes the place of a carbon atom in the graphene film, surface-transfer doping involves electron exchange between graphene and dopant atoms at or near the graphene surface. This results from the proximity of the dopant to the graphene, rather than the substitution of carbon atoms with dopant atoms. A major advantage of surface-transfer doping is that the doping occurs from alkali metals like sodium and potassium that are naturally and stably incorporated into existing, low-cost, commercially available substrate materials. This allows strong doping to occur simply upon transfer of the graphene onto the substrate surface, reducing costly and time-consuming process steps. The presence of the dopants in stable form within the substrate results in degradation-free doping, in contrast to the degradation of doping that typically occurs for externally introduced dopants due to dopant reactivity and environmental exposure. doping and the formation of stable compounds such as LiC6 are resistant to degradation over time when encapsulated.

Provided herein are compositions and devices comprising n-doped graphene films, and methods for producing n-doped graphene films. The n-doped graphene films of the present invention can be characterized by a persistent and strong n-doping that is resistant to degradation. The n-doped films of the present invention demonstrate high electrical conductivity and low sheet resistance without altering the optical transmission of the graphene.

Further provided are compositions and electronic devices comprising n-doped graphene films. The compositions comprise a graphene layer in contact with a doped polymer layer. The doped polymer layer comprises a metal salt, and preferably an alkali metal salt, dispersed in a polymer matrix. The metal in the polymer layer serves to induce charge carriers in the adjacent graphene layer. In some aspects, the doped polymer layer may be a substrate layer or may be a separate polymer layer coated on the substrate layer graphene.

FIG. 1, for example, provides a schematic illustrating exemplary methodology 100 for producing n-doped graphene films. In order for graphene to serve as a high-performance material in electronics applications, it advantageously has sufficiently high electrical conductivity, which is proportional to the product of the graphene carrier mobility and carrier concentration within the plane of the film. Intrinsic (undoped) graphene has a low carrier concentration which rules out intrinsic graphene as a suitable material for some applications. To achieve sufficiently high carrier concentrations to serve as high-performance materials in applications such as transparent electrodes, the graphene is doped with charge carriers. The present invention provides techniques for increasing the carrier concentration and electrical conductivity (i.e. low values of sheet resistance) of graphene by doping without substantially altering the optical transmission.

The term "graphene" as used herein refers to a polycyclic aromatic molecule formed from a plurality of carbon atoms covalently bound to each other. The covalently bound carbon atoms may form a 6-membered ring as a repeating unit, or may further include at least one of a 5-membered ring and a 7-membered ring. Accordingly, in the graphene, the covalently bound carbon atoms (generally having $sp^2$ hybridization) form a single layer. The graphene may have various structures which are determined according to the amount of the 5-membered rings and/or 7-membered rings which may be contained in the graphene. The term "graphene" used herein may refer to a single layer (single-layer graphene) or a plurality of layers (often referred to as either multi-layer graphene or few-layer graphite). The graphene may comprise 1-50 planar graphene sheets, for example as a growth of multi-layer graphene. Graphene layers in multi-layer graphene each occupy about 340 μm, and so multi-layer graphene (1-50 layers) may have a thickness of about 0.3 nm to about 170 nm, or in other aspects from about 1 nm to about 30 nm. These layer spacings increase by about 10% (from 340 pm to 370 pm per layer) for $LiC_6$ relative to unintercalated multi-layer graphene. Throughout the application, graphene may also be referred to as "Gr".

As used herein, the term "doping" refers to a process of increasing the concentration of charge carriers by providing electrons to or removing electrons from a part of a conjugated bonding it-orbit to provide conductivity to a conjugated compound, e.g., a polycyclic aromatic carbon compound. Here, the process of adding new electrons or removing electrons is referred to as "doping".

The term "dopant" as used herein refers an organic dopant, an inorganic dopant, or a combination including at least one of the foregoing.

The term "doped polymer" as used herein refers to a polymer further comprising an organic dopant or an inorganic dopant or a combination including at least one of the foregoing.

If the graphene is doped with a p-dopant, electrons flow out of the graphene, thereby increasing the work function of the graphene. On the other hand, if the graphene is doped with an n-dopant, electrons flow into the graphene, thereby reducing the work function of the graphene. By doping the graphene as described herein, the work function of the graphene may be controlled in various ways.

In step 102, graphene sheet is prepared by chemical vapor deposition (CVD). In this process, graphene is formed on a catalytic metal substrate through the decomposition of hydrocarbon precursors such as methane, commonly mixed with hydrogen, at suitable temperatures (~1000 C-1100 C) and pressures (~1 mTorr-10 Torr). (G. Deokar et al., *Towards high quality CVD graphene growth and transfer*, Carbon, 89, 82-92 (2015); N. C. Bartelt and K. F. McCarty, *Graphene growth on metal surfaces*, MRS Bulletin, 37, 1158-1165 (2012)). The graphene sheet can be prepared on a growth substrate, such as a metal substrate. Suitable metal substrates may be Cu, nickel, platinum, or iridium. To achieve uniform single-layer graphene sheets, most often a copper substrate is used. For multi-layer graphene, either copper or, more commonly, nickel is selected. These specific metals are chosen as they both act as a catalyst for graphene growth and due to the similar lattice spacing to that of graphene, provide minimal lattice mismatch between the materials. The graphene may comprise 1-50 planar graphene sheets, for example as a growth of multi-layer graphene. In one aspect, the graphene sheet(s) are optionally intercalated with alkali metal ions.

In another aspect, the graphene layer itself may comprise one or more dopants prior to it contact with the doped substrate or coating. For example, an alkali metal dopant may optionally be intercalated into the graphene prior to its treatment. The alkali metal dopant may be Na, Cs, Li, K, and Rb, with Li, Na and K being preferred. The graphene may be doped with the alkali metal dopant by, for example, contacting the graphene with a suitable electrolyte solution. The counterion to the alkali metal may be any anion that is unreactive and stable under the conditions of the graphene structure fabrication and use. Preferred counterions include $ClO_4^-$ and $PF_6^-$. The electrolyte solution further comprises a solvent for the alkali metal salt. Preferred solvents include ethylene carbonate (EC), diethyl carbonate (DEC), dimethyl carbonate (DMC), ethyl methyl carbonate (EMC), and mixtures thereof. The alkali metal salt may present in the electrolyte solution in a concentration from 0.5 to 2 M, or in a concentration sufficient to form $MC_{72}$, $MC_{36}$, $MC_{18}$, $MC_{12}$, and/or $MC_6$ (i.e., $LiC_{72}$, $LiC_{36}$, $LiC_{18}$, $LiC_{12}$, and/or $LiC_6$), and preferably $MC_6$. The electrolyte solution may further be in contact with a metal source, such as a metal foil, which maintains a high concentration of alkali metal in the electrolyte solution. In one embodiment, the multilayer graphene is contacted with 1-1.2 M $LiPF_6$ in 1:1 wt ratio of EC/DEC (Lithium hexafluorophosphate solution in ethylene carbonate and diethyl carbonate, while the electrolyte is contacted with Li metal foil. The alkali metal ions are intercalated into the multilayer graphene (for example, forming $LiC_{72}$, $LiC_{36}$, $LiC_{18}$, $LiC_{12}$, and/or $LiC_6$). The intercalated graphene is then used to form the laminate structure as provided herein. In this case, the interlayers preferably do not include additional alkali metal ions. The intercalated graphene is then used in the methods and structures provided herein. It may also occur that the doped polymers themselves, when contacted to graphene as part of the methods described herein, result in the intercalation of alkali metal ions into graphene, forming, for example $LiC_6$.

In step 104, a doped polymer solution is prepared containing an alkali metal salt, a polymer, and a solvent. The solution is stirred until the polymer and alkali metal salt completely dissolves into solution. The alkali metal may be selected from Li, Na and K. In one aspect, the alkali metal salt is $MClO_4$ or MI, where M can be Li, Na or K. In a further embodiment, the concentration of M is in the range of about 2% to about 45% by weight (w/w). Preferred solvents include water, chlorobenzene, acetone, methanol, N-methyl-2-pyrrolidone, tetrahydrofuran, dimethylformamide, hexane, toluene, isopropyl alcohol, acetonitrile, chloroform, acetic acid, 2-methoxyethanol, n-butylamine, or combinations thereof. The polymer may be selected from the following polymer classes: polyamides, polyimides, polychloroethylenes, polyurethanes, polyvinyl ethers, polythioureas, polyacrylates, polycarbonates, polyesters, polyethylenes, polypropylenes, polysytrenes, PTFE, polyethylacetates, polyvinylacetates and fluoropolymers. More preferable polymers include poly(methyl methacrylate), polyvinylbutyral, ethylene-vinyl acetate, thermoplastic polyurethane, polyethylene terephthalate, thermoset ethylene-vinyl acetate, polycarbonate and polyethylene. The concentration of polymer in the coating solution may range from 10 weight percent to 50 weight percent.

In a typical preparation, the doped polymer solution comprises about 10 weight percent to about 50 weight percent poly(methyl methacrylate) and about 10 weight percent to about 50 weight percent $NaClO_4$ in a solvent selected from chlorobenzene, N-methyl-2-pyrrolidone, tetrahydrofuran, and dimethylformamide. For example, a solvent is mixed with up to 20% alkali salt, and up to 20% polymer in solution and spun until fully dissolved.

In step 106, the surface of a substrate is coated with the doped polymer solution to form a coated substrate. According to an exemplary embodiment, the coating method can include spin coating, spraying, brushing, drop casting, blade coating, dip coating, or other suitable methods. Preferable polymers for the substrate include the following polymer classes: polyamides, polyimides, polychloroethylenes, polyurethanes, polyvinylethers, polythioureas, polyacrylates, polycarbonates, polyesters, polyethylenes, polypropylenes, polysytrenes, PTFE, polyethylacetates, polyvinylacetates and fluoropolymers. More preferable polymers include poly (methyl methacrylate), polyvinylbutyral, ethylene-vinyl acetate, thermoplastic polyurethane, polyethylene terephthalate, thermoset ethylene-vinyl acetate, polycarbonate and polyethylene. In a preferred embodiment, the substrate may be polyamides, polyimides, polychloroethylenes, polyurethanes, polyvinylethers, polythioureas, polyacrylates, polycarbonates, polyesters, polyethylenes, polypropylenes, polysytrenes, nylons, polyethylacetates, polyvinylacetates or fluoropolymers. In a more preferred embodiment, the substrate may be poly(methylmethacrylate), polycarbonate, polyethylene, polypropylene, polyester, nylon, and polyvinyl chloride. In a further embodiment, the substrate comprises an alkali metal salt incorporated within the substrate. In a typical preparation, the doped polymer solution is blade coated in a layer of about 500 μm thickness (or drop cast about 30 μL) of solution onto an acrylic substrate.

In step 112, the graphene is optionally coated with the doped polymer solution to form a coated graphene layer.

In step 108, the graphene layer from step 102 or 112 is contacted with the coated substrate from step 106.

In step 110, the n-doped graphene film is released from the metal film. Preferred methods of releasing the n-doped graphene film from the substrate include chemical etching, electrochemical delamination, or a heating step followed by a cooling step, followed by mechanical peeling in some cases. In an embodiment the heating step is performed in the range of about 100° C. to about 160° C., and the temperature is held for a time ranging from about 5 minutes to about 4 hours. In a typical preparation, the heating is performed in a vacuum oven at 150° C. for 1 hour in air, or in a vacuum chamber by pulling vacuum at −100 kPa, followed by adding $N_2$ at up to −60 kPa, followed by placing the substrate on a hot place at 150° C. for 1 hour. Alternatively, the heating is performed in a tube furnace by applying $N_2$ flow, increasing the temperature over 1 hour from room temperature to 150° C., then holding the temperature at 150° C. for 1 hour, then decreasing the temperature over 1 hour to room temperature. In an embodiment, the cooling step is performed in the range of about –10° C. to about 20° C., and the temperature is held for a time ranging from about 5 minutes to about 4 hours. In a typical preparation, the sample is placed in a freezer at about –10° C. for about 30 minutes. The Cu foil is usually easily removed, or lightly peeled if necessary, however no pressure is required to remove the Cu foil, which would result in release of the liquid polymer solution.

In an alternative embodiment, in step 114 the graphene sheet is coated with the doped polymer solution in the absence of a substrate, and the polymer is then cured (step 116) to harden. In this embodiment, the doped polymer layer should be thick and/or rigid enough to lend structural support once the metal is removed from the graphene. In step 116, the doped polymer is cured by heat under a vacuum or inert gas atmosphere, or ultraviolet light, depending on the polymer composition. Alternatively, after step 114, the coated graphene sheet is contacted with a substrate (step 108), followed by release of the n-doped graphene film (step 110).

In step 110/118, the n-doped graphene film is released from the graphene growth support. Preferred methods of releasing the n-doped graphene film from the substrate include chemical etching, electrochemical delamination, or a heating step followed by a cooling step followed by mechanical peeling in some cases. In an embodiment, the heating step is performed in the range of about 100° C. to about 160° C., and the temperature is held for a time ranging from about 5 minutes to about 4 hours. In an embodiment, the cooling step is performed in the range of about –10° C. to about 20° C., and the temperature is held for a time ranging from about 5 minutes to about 4 hours.

Advantageously, if a heating step followed by a cooling step is performed to release the doped graphene from the growth substrate, for certain polymers such as PMMA, the growth substrate is easily released from the doped graphene without the need for mechanical peeling. In comparison, some polymers require mechanical peeling after the heating and cooling steps, which can damage the graphene. Chemical etching does not require mechanical peeling, but can leave a residue that is detrimental to graphene's electronic properties. Electrochemical delamination removes the graphene from the Cu with no need for mechanical peeling.

Although illustrative embodiments of the present invention have been described herein, it is to be understood that the invention is not limited to those precise embodiments, and that various other changes and modifications may be made by one skilled in the art without departing from the scope of the invention.

The described methods can be used to prepare compositions comprising (i) a substrate, (ii) a doped polymer, and (iii) graphene. In an embodiment, the electron mobility of the graphene is greater than 2000 cm$^2$/Vs. The charger carrier concentration of the graphene may be greater than $5 \times 10^{12}$ electrons per cm$^2$.

The compositions can be used to make electronic and/or optical devices that may be in the form of complete devices, parts or sub elements of devices, electronic components, etc. They can comprise a substrate onto at least one surface of which has been applied a layer of an electrically conductive coating comprising graphene sheets and a doped polymer solution. In an embodiment, the electronic device is a flexible electronic device or an electrically conductive window material.

Printed electronics may be prepared by applying the compositions to a substrate in a pattern comprising an electrically conductive pathway designed to achieve the desired electronic device. The pathway may be solid, mostly solid, in a liquid or gel form, etc.

Other applications include, but are not limited to: passive and active devices and components; electrical and electronic circuitry, integrated circuits; flexible printed circuit boards; transistors; field-effect transistors; microelectromechanical systems (MEMS) devices; microwave circuits; antennas; diffraction gratings; indicators; chipless tags (e.g. for theft deterrence from stores, libraries, etc.); security and theft deterrence devices for retail, library, and other settings; key pads; smart cards; sensors; liquid crystalline displays (LCDs); signage; lighting; flat panel displays; flexible displays, including light-emitting diode, organic light-emitting diode, and polymer light-emitting diode displays; backplanes and frontplanes for displays; electroluminescent and OLED lighting; photovoltaic devices, including backplanes; product identifying chips and devices; membrane switches; batteries, including thin film batteries; electrodes; indicators; printed circuits in portable electronic devices (for example, cellular telephones, computers, personal digital assistants, global positioning system devices, music players, games, calculators, etc.); electronic connections made through hinges or other movable/bendable junctions in electronic devices such as cellular telephones, portable computers, folding keyboards, etc.); wearable electronics; and circuits in vehicles, medical devices, diagnostic devices, instruments, etc.

The electronic devices may be radiofrequency identification (RFID) devices and/or components thereof and/or radiofrequency communication device. Examples include, but are not limited to, RFID tags, chips, and antennas. The RFID devices may be ultrahigh frequency RFID devices, which typically operate at frequencies in the range of about 868 to about 928 MHz. Examples of uses for RFIDs are for tracking shipping containers, products in stores, products in transit, and parts used in manufacturing processes, passports, barcode replacement applications, inventory control applications, pet identification, livestock control; contactless smart cards; automobile key fobs; etc.

The electronic devices may also be elastomeric (such as silicone) contact pads and keyboards. Such devices can be used in portable electronic devices, such as calculators, cellular telephones, GPS devices, keyboards, music players, games, etc. They may also be used in myriad other electronic applications, such as remote controls, touch screens, automotive buttons and switches, etc.

EXAMPLES

Example 1: Preparation of Graphene

Graphene is prepared by chemical vapor deposition (CVD). In this process, graphene is formed on a catalytic metal substrate through the decomposition of hydrocarbon precursors such as methane, commonly mixed with hydrogen, at suitable temperatures (~1000 C-1100 C) and pressures (~1 mTorr-10 Torr). (G. Deokar et al., *Towards high quality CVD graphene growth and transfer*, Carbon, 89, 82-92 (2015). N. C. Bartelt and K. F. McCarty, *Graphene growth on metal surfaces*, MRS Bulletin, 37, 1158-1165 (2012)). Suitable metal substrates may be Cu, nickel, platinum, or iridium.

Example 2: Preparation of n-Doped Graphene Films

Step 1: Pressing the Sample

Each sample is prepared by cutting a large sheet of chemical vapor deposition (CVD)-deposited graphene on Cu (Gr/Cu) into eight millimeter by eight millimeter squares. Sheets of polyethylene terephthalate with an ethylene-vinyl acetate (EVA/PET) layer are cut into twelve millimeter by twelve millimeter sheets for use as a substrate. The graphene is placed face-down on the EVA side of the substrate and sandwiched in between silicone and paper, then placed into a hot press. The paper provides rigidity to the structure, and the silicone prevents the EVA from sticking to this paper, leaving excess substrate for contact deposition.

Step 2: Cu Removal

The Cu can be removed from the samples with various methods. The first method, Cu etching, is performed by placing the samples in small dishes filled with ammonium persulfate (APS). The Cu etches in the dish for twenty-four hours and then the Cu-less sample is removed. The second method, electrochemical delamination, consists of electrolysis in alkali salt. In this method, some of the hydrogen bubbles formed in the reaction are at the Cu-graphene interface, separating the Cu layer from the graphene in about ten seconds with twenty milliamps of current. Alternatively, the Cu may also be removed with the heat and cooling cycles, followed by peeling the Cu from graphene if needed. The sample is heated from about 100° C. to about 160° C., and the temperature is held for a time ranging from about 5 minutes to about 4 hours. The sample is then cooled at a temperature of about −10° C. to about 20° C., and the temperature is held for a time ranging from about 5 minutes to about 4 hours.

Example 3: Electron Mobility Measurement

The following example describes methods for measuring electron mobility.

Depositing Contacts for Four-Point Probing

Figure 5:
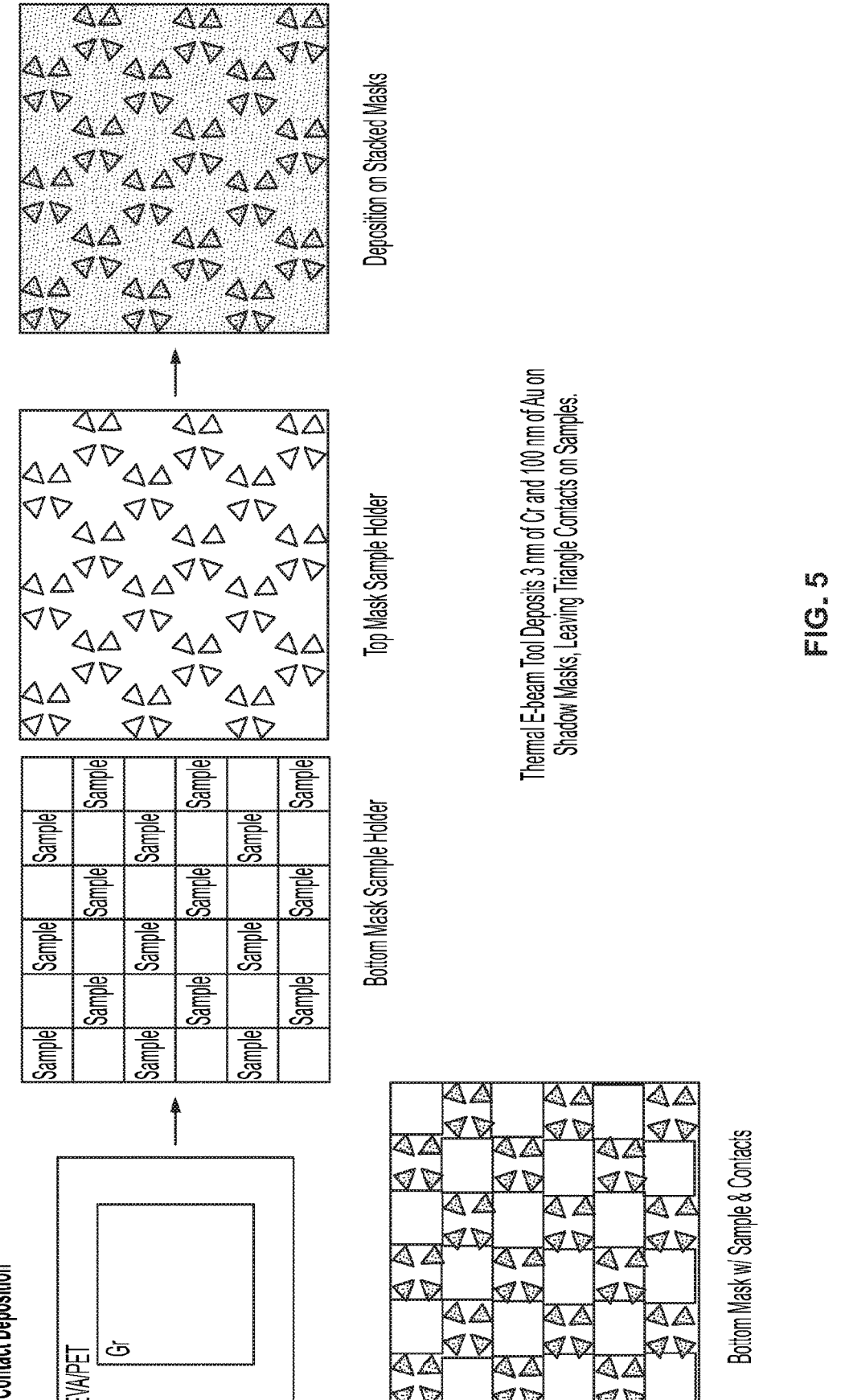
FIG. 5 is a schematic illustrating the contact deposition materials and process.

As shown in FIG. 5, contacts are deposited on the samples using shadow masks prepared in a laser cutter. The bottom mask contains twelve millimeter by twelve millimeter outlines onto which the sample substrates are aligned. The top mask is placed over the bottom mask, sandwiching the samples in between. The top mask contains four triangle-shaped cutouts on alternating twelve millimeter by twelve-millimeter squares. The cutouts provide an opening to the samples for the contacts to be deposited. The entire mask structure is placed in a Lesker 75 thermal evaporator/electron-beam tool (thermal e-beam tool), where three nanometers of chromium (Cr) and one-hundred nanometers of gold (Au) are deposited over the top mask. After pulling off the top mask, the samples will be left with four triangle-shaped Cr/Au contacts. This is essential for performing Hall effect measurements on a sample since it is a four-point probe technique.

LakeShore Device Setup

The device used to conduct sheet resistance, carrier concentration, and mobility measurements is a laboratory-standard LakeShore Model 8404 AC/DC Hall Effect Measurement system.

Figure 6:
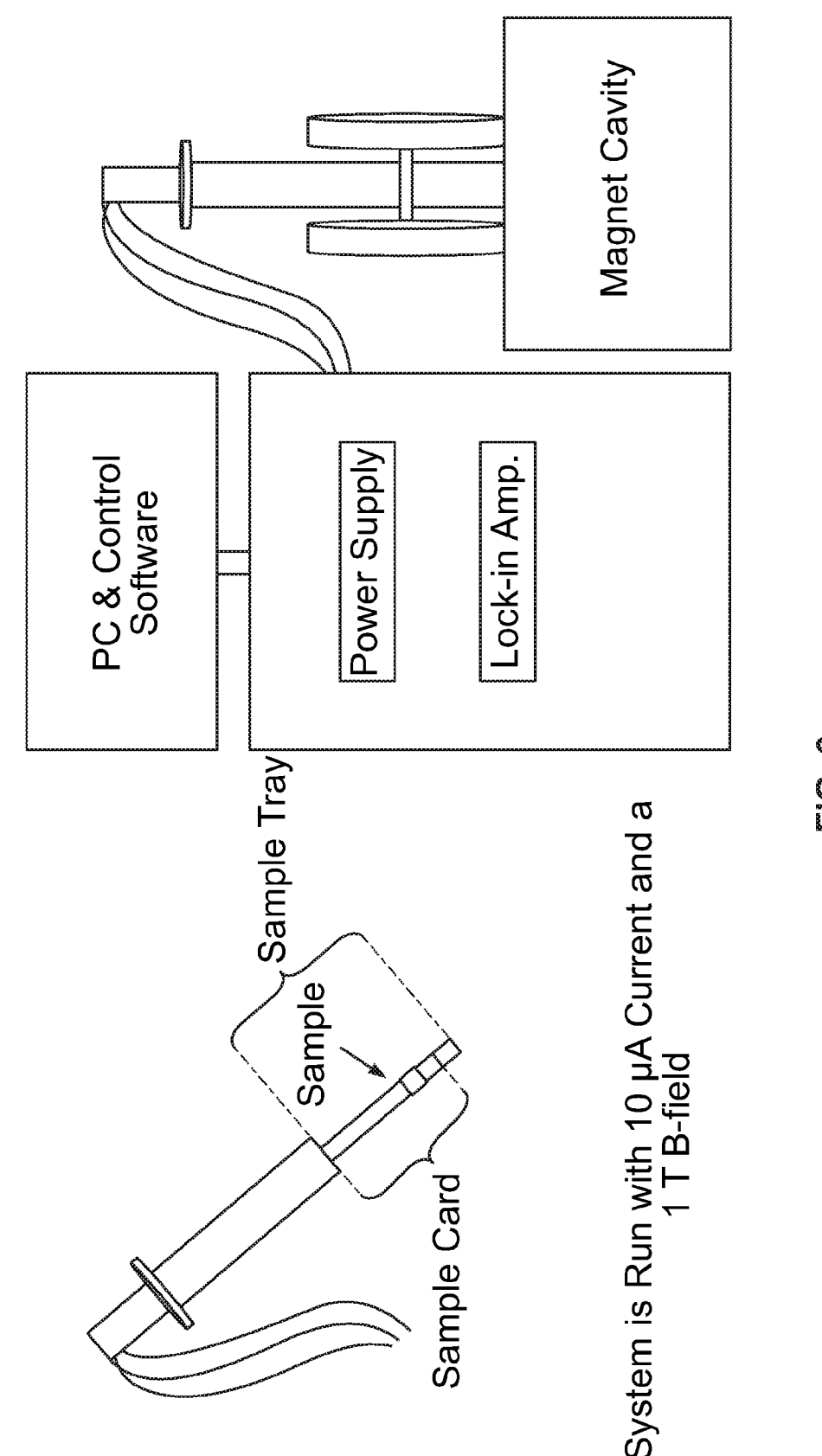
FIG. 6 is a schematic illustrating the Hall Effect System Setup.

The LakeShore Hall effect measurement system contains a sample chamber in which all stages of the measurement occur sequentially (see FIG. 6). The samples are mounted on sample holder cards with four soldered leads for contacting the corners of each sample, using either silver paste or direct placement of probing pins. In this van der Pauw configuration, with four contacts at the sample edge (see FIG. 7), the contact resistance of the leads is removed, so that only properties of the sample are measured.

Ohmic Check

Before obtaining the desired intrinsic properties of a sample, the quality of the contacts for measurement (and an estimate of the sample quality) is made via an ohmic check. In the four-probe van der Pauw configuration, a small (<10 uA) current is applied across two diagonal leads (1-3 or 2-4), and the resultant voltage is measured. This measurement is similar to applying multimeter probes across the sample to measure sheet resistance, but the large-area contacts ensures continuous connection for a stable reading.

Sheet Resistance Measurement

When probing samples whose resistance is on the same order as that of the contacts used for measurement, the four-point van der Pauw technique may be employed to find sample sheet resistance. The simplifying assumptions to be made of the film include: (1) sufficiently flat and uniformly thick, (2) unbroken (i.e., no holes), (3) homogeneous and isotropic (i.e., same in all directions), (4) with contacts at edges, and (5) with contact area at least an order of magnitude less than the film area.

By applying a small (<10 uA) current across two adjacent leads and measuring the resultant voltage across the remaining two adjacent leads, then averaging across multiple configurations, the contact resistance is eliminated. For the LakeShore system, two sample geometries (A and B shown in FIG. 7) are measured and their results are averaged, including current reversal methods to remove any undesired thermoelectric or offset voltages in the system.

Figure 7:
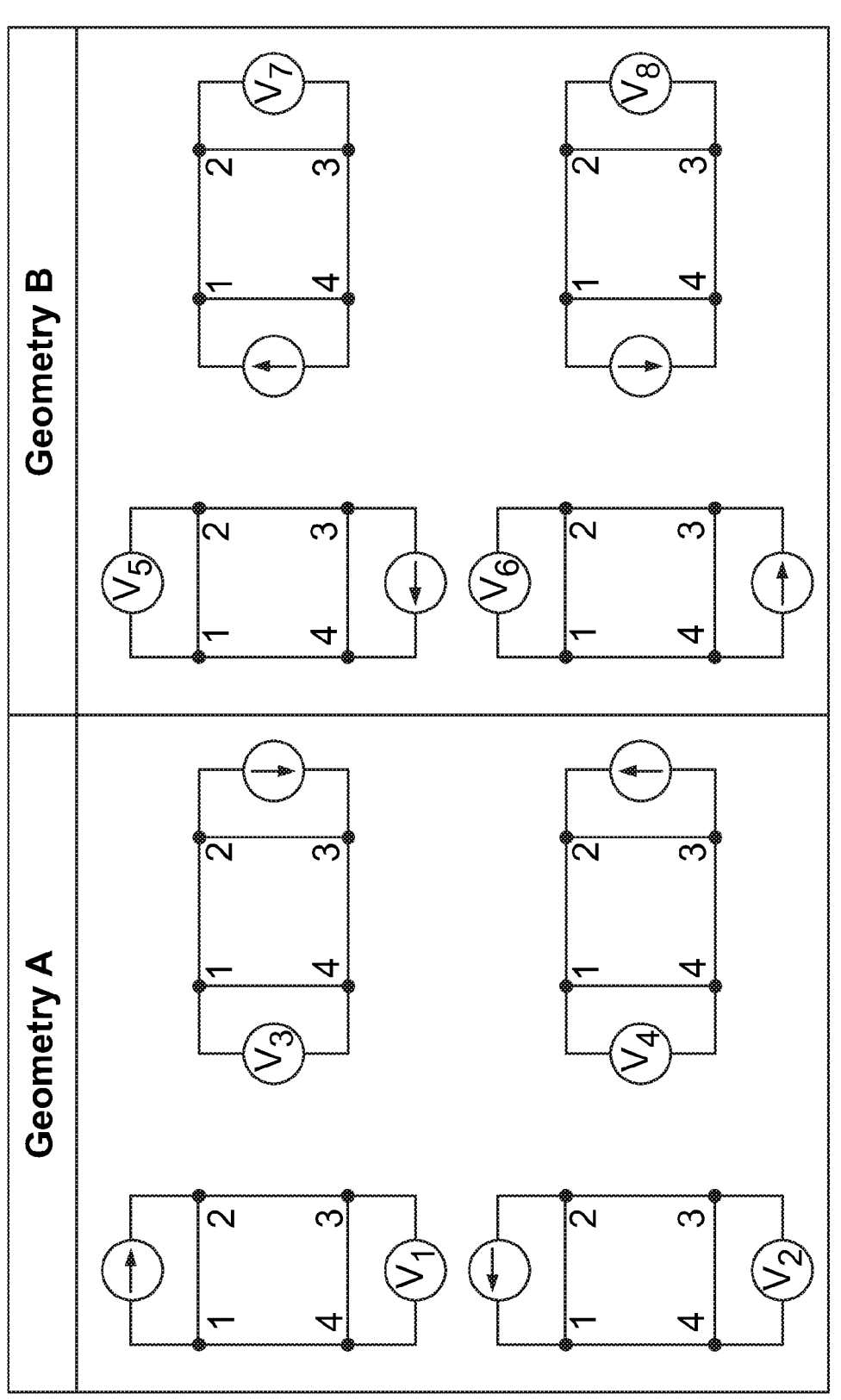
FIG. 7 is a schematic of van der Pauw configurations for sheet resistance measurement.

Using this method, a sample's sheet resistance is derived from a series of eight measurements made around the periphery of the sample, with configurations shown in FIG. 7. Once all voltage measurements are taken, two values of sheet resistance, $\rho_A$ and $\rho_B$, are obtained:

$$\rho_A = \frac{\pi}{\ln 2} f_A \frac{(V_1 - V_2 + V_3 - V_4)}{4I}$$

$$\rho_B = \frac{\pi}{\ln 2} f_A \frac{(V_5 - V_6 + V_7 - V_8)}{4I}$$

where $\rho_{(A\ (B))}$ is the sheet resistance in geometry A (B), $f_{(A\ (B))}$ is a geometrical factor based on sample symmetry, $V_1$-$V_8$ are measured voltages, and I is the applied current through the sample.

The geometrical factors $f_{(A\ (B))}$ represent the sample's symmetry of electrical conductivity (where $f_A = f_B = 1$ for perfect symmetry), and are related to the two resistance ratios $Q_A$ and $Q_B$, calculated from the measured voltages as:

$$Q_A = \frac{V_1 - V_2}{V_3 - V_4}$$

$$Q_B = \frac{V_5 - V_6}{V_7 - V_8}$$

The geometrical factors $f_{A\ (B)}$ are related to the resistance ratios $Q_{A\ (B)}$ by:

$$\frac{Q-1}{Q+1} = \frac{f}{\ln 2} \cosh^{-1}\left(\frac{e^{\ln 2/f}}{2}\right)$$

Figure 8:
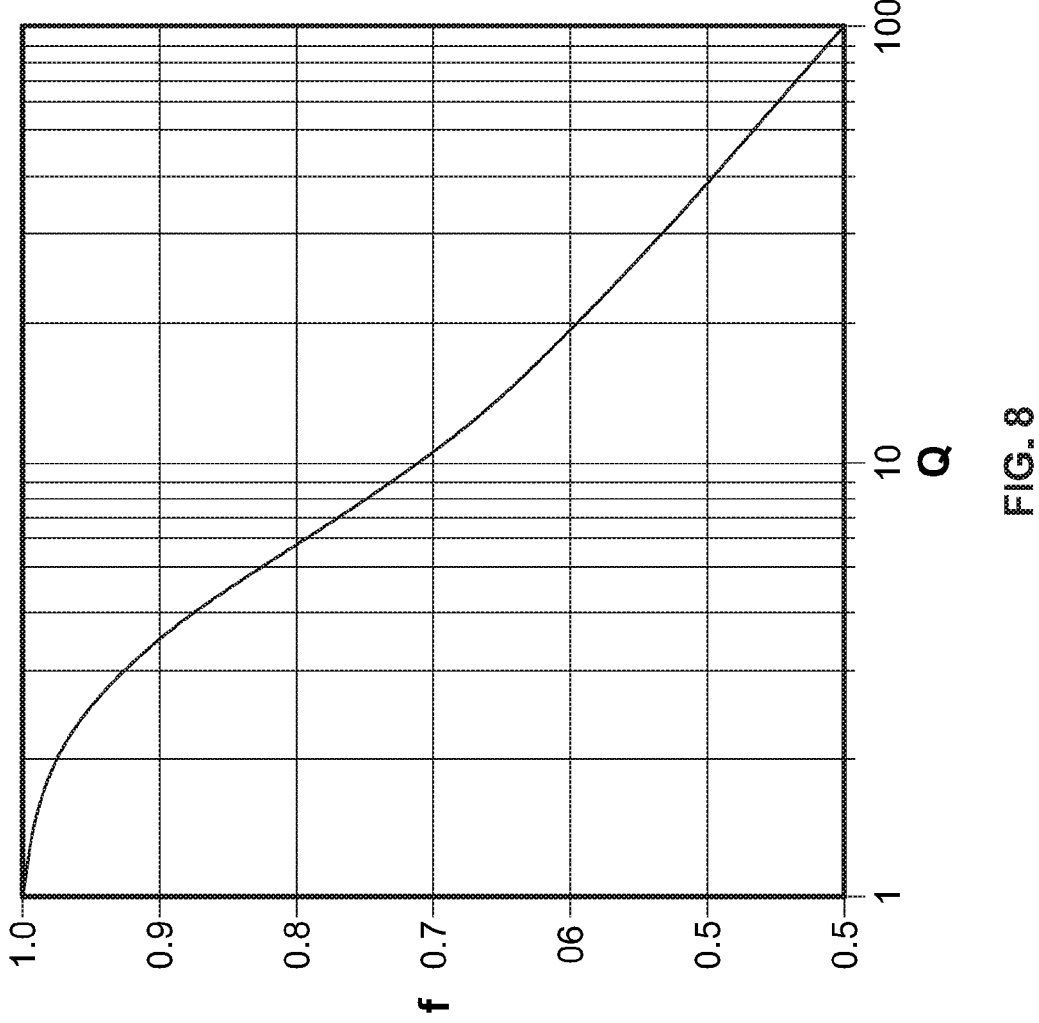
FIG. 8 is a plot of sample geometrical factor f vs. resistance quotient Q.

A plot of this transcendental function is shown in FIG. 8. The value of the geometrical factor $f_{A\ (B)}$ can be obtained once the corresponding resistance ratio $Q_{A\ (B)}$ is calculated.

Once $\rho_A$ and $\rho_B$ for the two geometries are known, the average sample sheet resistance is calculated as:

$$\rho_{sheet} = \frac{\rho_A + \rho_B}{2}$$

The average sheet resistance (measured in ohms($\Omega$)/square) for each sample is a key indicator of intrinsic electronic transport through the film. For samples constructed according to the methods described herein, the reported sheet resistance indicates charge flow through the Gr film on the substrate surface.

Hall Measurement

Figure 9:
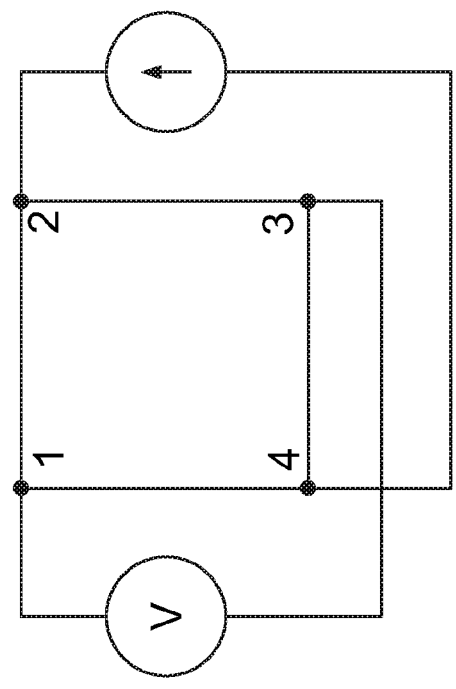
FIG. 9 is a schematic of van der Pauw configurations for resistance measurement.
Figure 9:
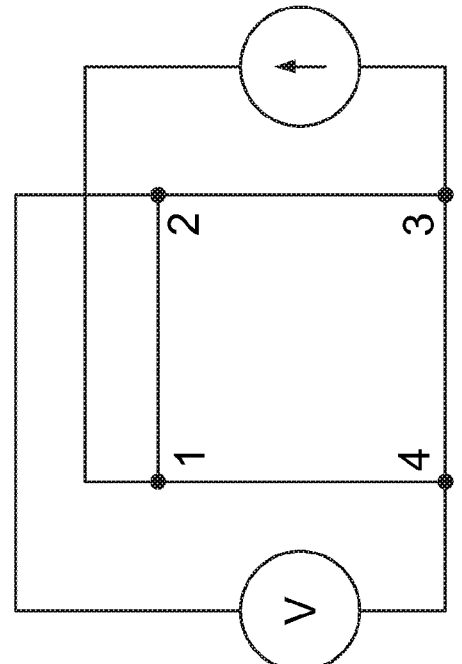

The Hall effect measurement is important to characterize electronic transport in semiconductor materials because, from the Hall voltage $V_H$, the electronic charge carrier type, density, and mobility may all be determined. With an applied magnetic field, this measurement is conducted using the LakeShore device, in the sample testing configurations shown in FIG. 9. Unlike the sheet resistance measurement method, the Hall effect measurement involves applying a small (<10 uA) current through two diagonally-placed contacts (1-3 or 2-4), and measuring the transverse voltage through the remaining two contacts.

With a positive magnetic field ($B^+$), a current is applied between contacts 1 and 3, and the voltage drop $V_{24+}$ between contacts 2 and 4 is measured. Using current reversal, the voltage $V_{42+}$ is also measured. Next, a current is applied between contacts 2 and 4, and the voltage drop $V_{13+}$ between contacts 1 and 3 is measured. Again, reversing the current, the voltage $V_{31+}$ is measured. Afterwards, the magnetic field is reversed (to $B^-$), and the above process is repeated to obtain the voltages $V_{24-}$, $V_{42-}$, $V_{13-}$, and $V_{31-}$. The overall Hall voltage is then computed as the average of the difference between measured voltages for positive and negative applied field:

$$V_H = \frac{(V_{24+} - V_{24-}) + (V_{42+} - V_{42-}) + (V_{13+} - V_{13-}) + (V_{31+} - V_{31-})}{8}$$

The polarity (sign) of this Hall voltage value indicates the charge carrier type of the semiconductor material (i.e., Gr); if it is positive, the material is designated "p-type" (with holes as the charge carrier), and if it is negative, the material is designated "n-type" (with electrons as the charge carrier).

Carrier Concentration Calculation

Using the Hall voltage value determined by the methods described above, the sheet (or 2D) charge carrier density may be computed as:

$$n_{sheet} = \frac{IB}{q|V_H|}$$

where I is the applied current, B is the applied magnetic field strength, $q=1.602\times10^{-19}$ C is the elementary charge, and $V_H$ is the Hall voltage.

The sheet (or 2D) carrier concentration is a useful indicator of available charge carriers within the sample. The sheet resistance is inversely proportional to the 2D carrier concentration. Gr samples exposed to air doping typically show carrier density of about 5e+12 cm$^{-2}$.

Mobility Concentration

Another key indicator of the quality of intrinsic electron transport within a material is charge carrier mobility, with units of cm$^2$/(Vs). The typical method for obtaining this measurement involves the Hall effect measurement, yielding the Hall mobility $\mu_H$. Using the Hall voltage obtained from the methods listed above, it can be calculated by:

$$\mu_H = \frac{1}{q n_{sheet} \rho_{sheet}}$$

where $q=1.602\times10^{-19}$ C is the elementary charge, $n_{sheet}$ is the sheet (2D) charge carrier concentration, and $\rho_{sheet}$ is the sheet resistance.

Charge carrier mobility is one of the most direct measures of electrical properties of a sample, as it indicates the response of the charge carriers to an applied electric field or voltage.

We claim:

1. A method for producing an n-doped graphene film on a substrate wherein the method comprises:
   (i) preparing a doped polymer solution free of graphene, the doped polymer solution comprising an alkali metal salt, a polymer and a solvent;
   (ii) coating a surface of a substrate with the doped polymer solution to form a coated substrate; and
   (iii) contacting an intrinsic graphene layer with the coated substrate to dope the intrinsic graphene layer, thereby producing the n-doped graphene film.

2. The method of claim 1, further comprising a heating step and a cooling step.

3. The method of claim 1, wherein the doped polymer solution is free of graphene.

4. The method of claim 1, wherein coating comprises spin coating, drop casting, blade coating or dip coating.

5. The method of claim 1, wherein the n-doped graphene film is on a growth substrate.

6. The method of claim 1, in which the method further comprises release of the growth substrate from the n-doped graphene film.

7. The method of claim 6, wherein the release of the growth substrate from the n-doped graphene film comprises chemical etching, electrochemical delamination, a heating step followed by a cooling step, or a heating step followed by a cooling step followed by mechanical peeling.

8. The method of claim 1, wherein the polymer is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, PTFE, polyethylacetates, polyvinylacetates and fluoropolymers.

9. The method of claim 8, wherein the polymer is selected from the group consisting of poly(methyl methacrylate), polyvinylbutyral, ethylene-vinyl acetate, thermoplastic polyurethane, polyethylene terephthalate, thermoset ethylene-vinyl acetate, polycarbonate and polyethylene.

10. The method of claim 1, wherein the alkali-metal salt is selected from the group consisting of $MClO_4$ or MI, wherein M is selected from the group consisting of Li, Na and K.

11. The method of claim 10, wherein the concentration of M is in the range about 2% to about 45% by weight (w/w).

12. The method of claim 1, wherein the substrate is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, nylons, polyethylacetates, polyvinylacetates and fluoropolymers.

13. The method of claim 12, wherein the substrate is selected from the group consisting of poly(methyl methacrylate), polycarbonate, polyethylene, polypropylene, polyester, nylon, and polyvinyl chloride.

14. The method of claim 1, wherein the solvent is selected from the group consisting of water, chlorobenzene, acetone, methanol, N-Methyl-2-pyrrolidone, tetrahydrofuran, dimethylformamide, hexane, toluene, isopropyl alcohol, acetonitrile, chloroform, acetic acid, 2-methoxyethanol, or n-butylamine.

15. The method of claim 5, wherein the growth substrate is a metal substrate.

16. The method of claim 15, wherein the metal substrate is selected from the group consisting of copper, nickel, platinum, and iridium.

17. The method of claim 1, wherein the substrate comprises an alkali metal salt incorporated within the substrate.

18. The method of claim 1, wherein the doped polymer solution comprises about 10 weight percent to about 50 weight percent poly(methyl methacrylate) and about 10 weight percent to about 50 weight percent $NaClO_4$ in a solvent, wherein the solvent is selected from the group consisting of chlorobenzene, N-Methyl-2-pyrrolidone, tetrahydrofuran, and dimethylformamide.

19. The method of claim 1, wherein the heating step is performed in the range of about 100° C. to about 160° C., and the temperature is held for a time ranging from about 5 minutes to about 4 hours.

20. The method of claim 1, wherein the cooling step is performed in the range of about −10° C. to about 20° C., and the temperature is held for a time ranging from about 5 minutes to about 4 hours.

21. A method for producing an n-doped graphene film on a substrate wherein the method comprises:
  (i) preparing a doped polymer solution free of graphene, the doped polymer solution comprising an alkali metal salt, a polymer and a solvent;
  (ii) coating an intrinsic graphene layer with the doped polymer solution to form a coated graphene layer;
  (iii) coating a surface of a substrate with the doped polymer solution to form a coated substrate; and
  (iv) contacting the coated graphene layer with the coated substrate to dope the intrinsic graphene layer, thereby producing the n-doped graphene film.

22. The method of claim 21, further comprising a heating step and a cooling step.

23. The method of claim 21, wherein the doped polymer solution is free of graphene.

24. The method of claim 21, further comprising a mechanical peeling step.

25. The method of claim 21, wherein coating comprises spin coating, drop casting, blade coating or dip coating.

26. The method of claim 21, wherein the n-doped graphene film is on a growth substrate.

27. The method of claim 21, in which the method further comprises release of the growth substrate from the graphene.

28. The method of claim 27, wherein the release of the growth substrate from the graphene comprises chemical etching, electrochemical delamination, a heating step followed by a cooling step, or a heating step followed by a cooling step followed by a mechanical peeling step.

29. The method of claim 21, wherein the polymer is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, PTFE, polyethylacetates, polyvinylacetates and fluoropolymers.

30. The method of claim 29, wherein the polymer is selected from the group consisting of poly(methyl methacrylate), polyvinylbutyral, ethylene-vinyl acetate, thermoplastic polyurethane, polyethylene terephthalate, thermoset ethylene-vinyl acetate, polycarbonate and polyethylene.

31. The method of claim 21, the alkali-metal salt is selected from the group consisting of $MClO_4$ or MI, wherein M is selected from the group consisting of Li, Na and K.

32. The method of claim 31, wherein the concentration of M is in the range about 2% to about 45% by weight (w/w).

33. The method of claim 21, wherein the solvent is selected from the group consisting of water, chlorobenzene, acetone, methanol, N-Methyl-2-pyrrolidone, tetrahydrofuran, dimethylformamide, hexane, toluene, isopropyl alcohol, acetonitrile, chloroform, acetic acid, 2-methoxyethanol, or n-butylamine.

34. The method of claim 26, wherein the growth substrate is a metal substrate.

35. The method of claim 34, wherein the metal substrate is selected from the group consisting of copper, nickel, platinum, and iridium.

36. The method of claim 21, wherein the doped polymer solution comprises about 10 weight percent to about 50 weight percent poly(methyl methacrylate) and about 10 weight percent to about 50 weight percent $NaClO_4$ in a solvent, wherein the solvent is selected from the group consisting of chlorobenzene, N-Methyl-2-pyrrolidone, tetrahydrofuran, and dimethylformamide.

37. The method of claim 22, wherein the heating step is performed in the range of about 100° C. to about 160° C., and the temperature is held for a time ranging from about 5 minutes to about 4 hours.

38. The method of claim 23, wherein the cooling step is performed in the range of about −10° C. to about 20° C., and the temperature is held for a time ranging from about 5 minutes to about 4 hours.

39. The method of claim 1, wherein the electron mobility of the graphene in the n-doped graphene film is greater than 2000 $cm^2$/Vs.

40. The method of claim 1, wherein the charge carrier concentration of graphene in the n-doped graphene film is greater than $5 \times 10^{12}$ electrons per $cm^2$.

41. The method of claim 21, wherein the electron mobility of graphene in the n-doped graphene film is greater than 2000 $cm^2$/Vs.

42. The method of claim 21, wherein the charge carrier concentration of graphene in the n-doped graphene film is greater than $5 \times 10^{12}$ electrons per $cm^2$.

* * * * *